(12) United States Patent
Fauber

(10) Patent No.: US 11,924,069 B2
(45) Date of Patent: Mar. 5, 2024

(54) TIME-SERIES TELEMETRY DATA COMPRESSION

(71) Applicant: Dell Products L.P., Round Rock, TX (US)

(72) Inventor: Ben Fauber, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 17/581,208

(22) Filed: Jan. 21, 2022

(65) Prior Publication Data

US 2023/0239224 A1    Jul. 27, 2023

(51) Int. Cl.
| | | |
|---|---|---|
| G06F 15/173 | (2006.01) | |
| G06F 18/20 | (2023.01) | |
| H03M 7/30 | (2006.01) | |
| H04L 43/02 | (2022.01) | |
| H04L 43/04 | (2022.01) | |

(52) U.S. Cl.
CPC ............ *H04L 43/02* (2013.01); *G06F 18/20* (2023.01); *H03M 7/3059* (2013.01); *H03M 7/70* (2013.01); *H04L 43/04* (2013.01)

(58) Field of Classification Search
None
See application file for complete search history.

(56) References Cited

U.S. PATENT DOCUMENTS

| | | | |
|---|---|---|---|
| 7,296,132 B1 | 11/2007 | Gross et al. | |
| 8,370,586 B2 | 2/2013 | Whisnant et al. | |
| 10,715,393 B1 * | 7/2020 | Madhavan | ............ H04L 41/16 |
| 11,403,000 B1 * | 8/2022 | Barker, Jr. | ............ G06F 3/0664 |
| 11,416,298 B1 * | 8/2022 | Barker, Jr. | ............ G06F 3/0631 |

(Continued)

FOREIGN PATENT DOCUMENTS

| | | | | |
|---|---|---|---|---|
| CN | 114448598 A | 5/2022 | | |
| WO | WO-2007120965 A2 * | 10/2007 | ......... | G06F 11/3003 |

OTHER PUBLICATIONS

Office Action dated Aug. 4, 2023 for U.S. Appl. No. 17/675,848, 32 pages.

(Continued)

*Primary Examiner* — Phyllis A Book
(74) *Attorney, Agent, or Firm* — Amin, Turocy & Watson, LLP

(57) ABSTRACT

A system can identify a first group of time-series telemetry data that represents performance metrics of a computing device, wherein the first group of time-series telemetry data identifies respective first values and corresponding respective first timestamps. The system can create a second group of time-series telemetry data that identifies second timestamps. The system can populate the second group of time-series telemetry data with the respective first values at respective first locations of the second group of time-series telemetry data that correspond to the respective first timestamps of the respective first values. The system can create a tensor that identifies third timestamps. The system can populate the tensor with the respective first values at respective second locations of the tensor that correspond to the respective first timestamps of the respective first values, wherein populating the tensor comprises combining two values of the respective first values.

20 Claims, 13 Drawing Sheets

(56) References Cited

U.S. PATENT DOCUMENTS

| | | | |
|---|---|---|---|
| 2009/0067080 A1* | 3/2009 | Gross | G11B 33/08 |
| | | | 360/71 |
| 2009/0106521 A1* | 4/2009 | Whisnant | H03M 7/30 |
| | | | 711/170 |
| 2017/0351964 A1 | 12/2017 | Gross et al. | |
| 2017/0359234 A1 | 12/2017 | Gross et al. | |
| 2019/0149440 A1* | 5/2019 | Rantzau | H04L 43/045 |
| | | | 370/241 |
| 2019/0243407 A1* | 8/2019 | Gross | G06F 18/00 |
| 2019/0243799 A1* | 8/2019 | Gross | G06F 18/28 |
| 2019/0258677 A1* | 8/2019 | Beedgen | G06F 16/90335 |
| 2019/0318251 A1* | 10/2019 | Gross | G06N 5/04 |
| 2019/0370085 A1* | 12/2019 | Gross | G06F 1/3206 |
| 2020/0334540 A1* | 10/2020 | Borra | G06F 11/3003 |
| 2021/0111974 A1* | 4/2021 | Tayeb | H04L 43/065 |
| 2021/0158106 A1* | 5/2021 | Vasseur | G06F 18/2193 |
| 2022/0050598 A1 | 2/2022 | Kukla | |
| 2022/0107847 A1 | 4/2022 | Shaffer et al. | |
| 2022/0245485 A1* | 8/2022 | Cady | G06N 5/04 |
| 2022/0413481 A1 | 12/2022 | Gawlick et al. | |

OTHER PUBLICATIONS

Fauber et al. "Compression of Telemetry Sensor Data with Linear Mappings" U.S. Appl. No. 17/675,848, filed Feb. 18, 2022, 59 pages.

Notice of Allowance dated Dec. 1, 2023 for U.S. Appl. No. 17/675,848, 29 pages.

\* cited by examiner

1000

(1002)

↓

IDENTIFYING A FIRST GROUP OF TIME-SERIES TELEMETRY DATA THAT REPRESENTS PERFORMANCE METRICS OF A COMPUTING DEVICE, WHEREIN THE FIRST GROUP OF TIME-SERIES TELEMETRY DATA IDENTIFIES RESPECTIVE FIRST VALUES AND CORRESPONDING RESPECTIVE FIRST TIME STAMPS, WHEREIN RESPECTIVE FIRST NUMERICAL DISTANCES BETWEEN THE RESPECTIVE FIRST TIME STAMPS ARE IRREGULAR 1004

↓

CREATING A SECOND GROUP OF TIME-SERIES TELEMETRY DATA THAT IDENTIFIES SECOND TIME STAMPS, WHEREIN RESPECTIVE SECOND NUMERICAL DISTANCES BETWEEN RESPECTIVE SECOND TIME STAMPS OF THE SECOND TIME STAMPS ARE REGULAR 1006

↓

POPULATING THE SECOND GROUP OF TIME-SERIES TELEMETRY DATA WITH THE RESPECTIVE FIRST VALUES AT RESPECTIVE FIRST LOCATIONS OF THE SECOND GROUP OF TIME-SERIES TELEMETRY DATA THAT CORRESPOND TO THE RESPECTIVE FIRST TIME STAMPS OF THE RESPECTIVE FIRST VALUES 1008

↓

CREATING A TENSOR THAT IDENTIFIES THIRD TIME STAMPS, WHEREIN A NUMBER OF THE THIRD TIME STAMPS IS LESS THAN A NUMBER OF THE SECOND TIME STAMPS, AND WHEREIN RESPECTIVE THIRD NUMERICAL DISTANCES BETWEEN RESPECTIVE THIRD TIME STAMPS OF THE THIRD TIME STAMPS ARE REGULAR 1010

↓

POPULATING THE TENSOR WITH THE RESPECTIVE FIRST VALUES AT RESPECTIVE SECOND LOCATIONS OF THE TENSOR THAT CORRESPOND TO THE RESPECTIVE FIRST TIME STAMPS OF THE RESPECTIVE FIRST VALUES, WHEREIN POPULATING THE TENSOR COMPRISES COMBINING TWO VALUES OF THE RESPECTIVE FIRST VALUES, AND WHEREIN A DATA SIZE OF THE TENSOR IS LESS THAN A DATA SIZE OF THE FIRST GROUP OF TIME-SERIES TELEMETRY DATA 1012

↓

PERFORMING A DATA SCIENCE OPERATION ON THE TENSOR TO PRODUCE A FIRST RESULT, WHEREIN THE FIRST RESULT IS WITHIN A SPECIFIED THRESHOLD VALUE OF A SECOND RESULT OF PERFORMING THE DATA SCIENCE OPERATION ON THE FIRST GROUP OF TIME-SERIES TELEMETRY DATA 1014

IDENTIFYING, BY A SYSTEM COMPRISING A PROCESSOR, A FIRST GROUP OF TIME-SERIES TELEMETRY DATA, WHEREIN THE FIRST GROUP OF TIME-SERIES TELEMETRY DATA IDENTIFIES RESPECTIVE FIRST VALUES AND CORRESPONDING RESPECTIVE FIRST TIME STAMPS, WHEREIN RESPECTIVE FIRST NUMERICAL DISTANCES BETWEEN THE RESPECTIVE FIRST TIME STAMPS ARE IRREGULAR 1104

CREATING, BY THE SYSTEM, A TENSOR THAT IDENTIFIES SECOND TIME STAMPS, WHEREIN RESPECTIVE SECOND NUMERICAL DISTANCES BETWEEN RESPECTIVE THIRD TIME STAMPS OF THE THIRD TIME STAMPS ARE REGULAR 1106

POPULATING, BY THE SYSTEM, THE TENSOR WITH THE RESPECTIVE FIRST VALUES AT RESPECTIVE FIRST LOCATIONS OF THE TENSOR THAT CORRESPOND TO THE RESPECTIVE FIRST TIME STAMPS OF THE RESPECTIVE FIRST VALUES, WHEREIN POPULATING THE TENSOR COMPRISES COMBINING TWO VALUES OF THE RESPECTIVE FIRST VALUES, AND WHEREIN A DATA SIZE OF THE TENSOR IS LESS THAN A DATA SIZE OF THE FIRST GROUP OF TIME-SERIES TELEMETRY DATA 1108

PERFORMING, BY THE SYSTEM, A DEFINED DATA PROCESSING OPERATION ON THE TENSOR TO PRODUCE A FIRST RESULT, WHEREIN THE FIRST RESULT IS WITHIN A PREDETERMINED THRESHOLD VALUE OF A SECOND RESULT OF PERFORMING THE DEFINED DATA PROCESSING ON THE FIRST GROUP OF TIME-SERIES TELEMETRY DATA 1110

TIME-SERIES TELEMETRY DATA COMPRESSION

BACKGROUND

Data compression can comprise an encoding of data where a compressed version of the data can be expressed with fewer bytes than an uncompressed version of the data.

SUMMARY

The following presents a simplified summary of the disclosed subject matter in order to provide a basic understanding of some of the various embodiments. This summary is not an extensive overview of the various embodiments. It is intended neither to identify key or critical elements of the various embodiments nor to delineate the scope of the various embodiments. Its sole purpose is to present some concepts of the disclosure in a streamlined form as a prelude to the more detailed description that is presented later.

An example system can operate as follows. The system can identify a first group of time-series telemetry data that represents performance metrics of a computing device, wherein the first group of time-series telemetry data identifies respective first values and corresponding respective first timestamps, wherein respective first numerical distances between the respective first timestamps are irregular. The system can create a second group of time-series telemetry data that identifies second timestamps, wherein respective second numerical distances between respective second timestamps of the second timestamps are regular. The system can populate the second group of time-series telemetry data with the respective first values at respective first locations of the second group of time-series telemetry data that correspond to the respective first timestamps of the respective first values. The system can create a tensor that identifies third timestamps, wherein a number of the third timestamps is less than a number of the second timestamps, and wherein respective third numerical distances between respective third timestamps of the third timestamps are regular. The system can populate the tensor with the respective first values at respective second locations of the tensor that correspond to the respective first timestamps of the respective first values, wherein populating the tensor comprises combining two values of the respective first values, and wherein a data size of the tensor is less than a data size of the first group of time-series telemetry data. The system can perform a data science operation on the tensor to produce a first result, wherein the first result is within a specified threshold value of a second result of performing the data science operation on the first group of time-series telemetry data.

A method can comprise identifying, by a system comprising a processor, a first group of time-series telemetry data, wherein the first group of time-series telemetry data identifies respective first values and corresponding respective first timestamps, wherein respective first numerical distances between the respective first timestamps are irregular. The method can further comprise creating, by the system, a tensor that identifies second timestamps, wherein respective second numerical distances between respective third timestamps of the third timestamps are regular. The method can further comprise populating, by the system, the tensor with the respective first values at respective first locations of the tensor that correspond to the respective first timestamps of the respective first values, wherein populating the tensor comprises combining two values of the respective first values, and wherein a data size of the tensor is less than a data size of the first group of time-series telemetry data. The method can further comprise performing, by the system, a defined data processing operation on the tensor to produce a first result, wherein the first result is within a predetermined threshold value of a second result of performing the defined data processing on the first group of time-series telemetry data.

An example non-transitory computer-readable medium can comprise instructions that, in response to execution, cause a system comprising a processor to perform operations. These operations can comprise identifying a first group of time-series telemetry data, wherein the first group of time-series telemetry data identifies respective first values and corresponding respective first timestamps. These operations can further comprise creating a tensor that identifies second timestamps. These operations can further comprise populating the tensor with the respective first values at respective first locations of the tensor that correspond to the respective first timestamps of the respective first values, wherein populating the tensor comprises combining two values of the respective first values, and wherein a data size of the tensor is less than a data size of the first group of time-series telemetry data. These operations can further comprise storing the tensor.

BRIEF DESCRIPTION OF THE DRAWINGS

Numerous embodiments, objects, and advantages of the present embodiments will be apparent upon consideration of the following detailed description, taken in conjunction with the accompanying drawings, in which like reference characters refer to like parts throughout, and in which:

FIG. 10 illustrates an example process flow for time-series telemetry data compression, in accordance with an embodiment of this disclosure;

FIG. 11 illustrates another example process flow for time-series telemetry data compression, in accordance with an embodiment of this disclosure;

DETAILED DESCRIPTION

Overview

Figure 1:
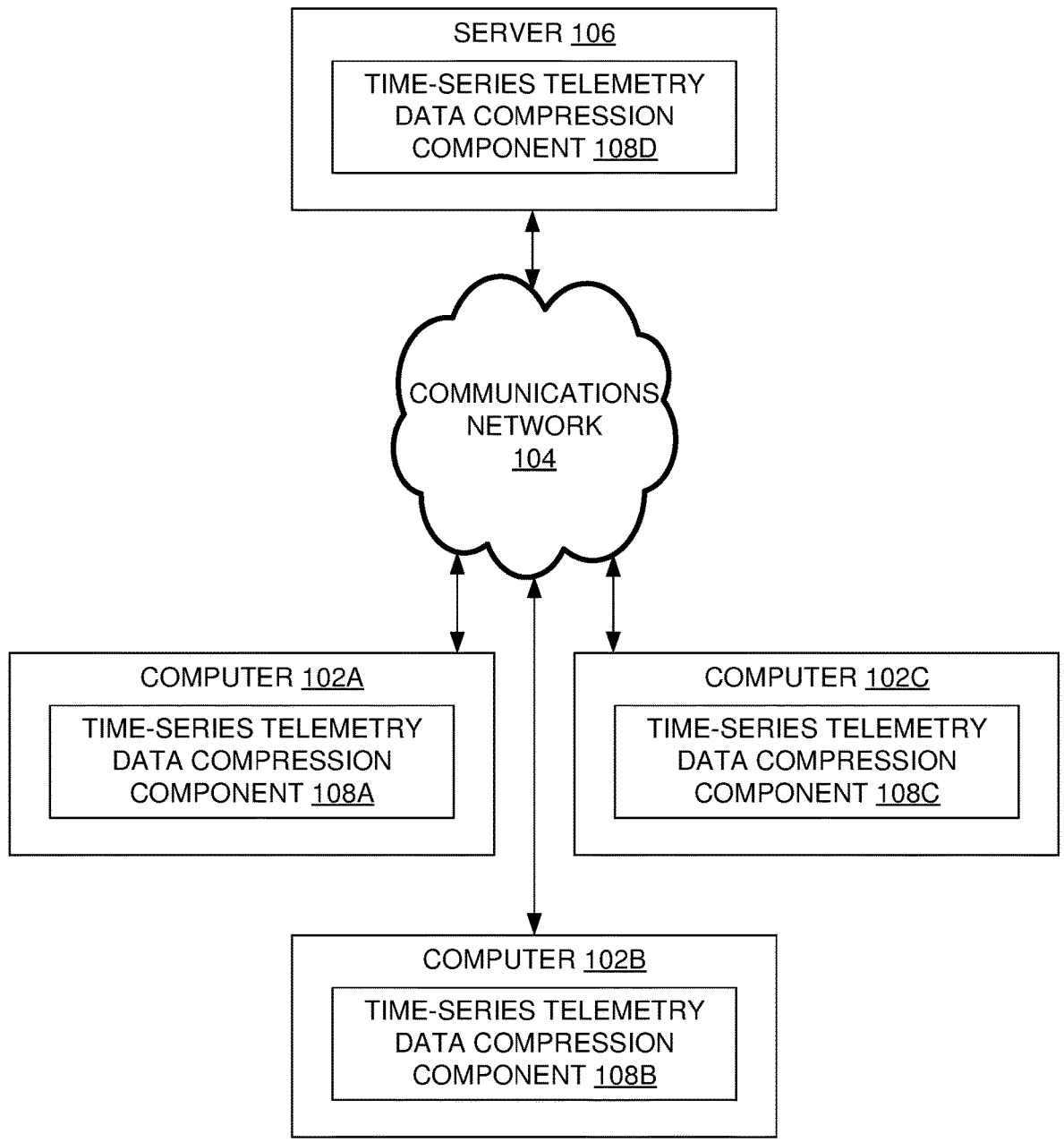
FIG. 1 illustrates an example system architecture that can facilitate time-series telemetry data compression, in accordance with an embodiment of this disclosure.

Exploiting information stored in event logs and telemetry data (data generated in recording and transmitting the readings of an instrument) can be an evolving area of process mining research, with applications in process discovery and process enhancement. Large telemetry file sizes, along with brittle, unsecure, and small data pipelines to stream external telemetry data back to data centers can hobble an ability to collect and protect valuable external high-frequency telemetry data. High-frequency telemetry data can be instrumental in detecting anomalies in hardware and proactively supporting users of that hardware.

Additionally, the present techniques can be implemented to compress telemetry data for transmission from devices (e.g. "on-the-box") to the near- and far-edge. The present techniques can be nearly lossless (where lossless compression allows for perfect reconstruction of an original data input from a compressed version of that data), while formally being a lossy method. The present techniques can provide favorable data compression to better than 1/300th (0.3%) of the memory footprint required by an original telemetry data set. The present techniques can be generalizable to irregular time series data (that is, time series data that occurs at irregular intervals) and can be applied to time series data of any dimension.

The present techniques can be applied to time series data of irregular and mixed frequencies. While the present techniques are formally lossy, the techniques can be nearly lossless.

The present techniques can be implemented to provide data compression to better than 1/300th (0.3%) of a memory footprint required by an original telemetry data set when in CSV format (and file size reductions using the present techniques can be even better when compared against JSON format data). The present techniques are generalizable to irregular time series data and can be applied to time series data of any dimension. The present techniques can be implemented to create a small memory footprint for data. The present techniques can be implemented to increase an opportunity to collect and transmit high-frequency telemetry data that can be used for anomaly detection.

The present techniques can be applied to tabular time series data to create a small memory footprint tensor that represents the same information that was in an original tabular data set. The present techniques can be applicable to integer and float time series data of any frequency.

Further, the present techniques can provide tensors that have an even smaller memory footprint if the time series data is sufficiently sparse. In some examples of the present techniques, there can be storage of a sparse tensor in a format where nonzero values are stored in list-of-lists, list-of-sets, array, or dictionary formats. In all formats, the nonzero values can be stored as index (that is, key) and value pairs, further reducing the memory footprint in comparison to a full-size tensor.

The present techniques can be applied to time series data of irregular and mixed frequencies. The present techniques can differ from a sequence-matching approach of dynamic time warping that runs in O(n2) time complexity. Rather, the present techniques can provide for O(n) time complexity and use a convolutional approach (that is different from a convolutional neural network) to create the aligned time series tensor.

The present techniques can be utilized to decompress telemetry data tensors into original tabular format. These telemetry data compression techniques can be nearly lossless yet is formally a lossy method due to a convolutional approach associated with the techniques that might compromise some fidelity upon decompression.

In some prior approaches, telemetry data can be batched or bundled into timestamped metric readings, which can then be bundled into documents, such as JavaScript Object Notation (JSON) documents. In some examples there can be approximately 20 predefined JSON documents that are sent at a larger interval. In some examples, telemetry data delivery intervals can be as short as every minute (for data that is collected every 1-5 seconds and transferred internally from internal data centers) to as infrequent as every 3 weeks (for data collected daily from external hardware).

On-premises (sometimes referred to as on-prem) data collectors can receive many pieces of telemetry data from different hardware. The disparate data can be grouped together and transmitted to a central database. At the central database, the grouped data can be processed, and individual timestamped metric values can be ingested into a tabular database along with relevant metadata, like source identifier and metric instance information and metric group (where defined).

Telemetry JSON files can be large, sometimes two-to-three-fold as large as their corresponding comma separated values (CSV) files. These large JSON files can be most suitable for telemetry data transmissions where large and robust data pipelines exist, such as with internal data center transfers. However, these opportunities can be rare, and in contrast, a more common case can involve a brittle, unsecure, and small data pipeline to stream external telemetry data back to data centers. As such, an improvement can be to provide a better telemetry data transmission format that has a small memory footprint.

Transmitting only CSV files can reduce a file size of telemetry data that is streamed to data centers. While this approach could reduce a data transmission burden two-to-three-fold, it could be that it would not create a substantial reduction in data transmission burden as seen with an approach that provides for an orders of magnitude reduction.

Large JSON file sizes, along with brittle, unsecure, and small data pipelines to stream external telemetry data back to data centers, can hobble an ability to collect and protect external high-frequency telemetry data. High-frequency telemetry data can be instrumental in an ability to detect anomalies in hardware, and proactively support users of that hardware. As such, there can be a need to create an improved telemetry data transmission format with a small memory footprint to increase an opportunity for high-frequency telemetry data that can be used for anomaly detection and user support.

Example Architectures, Tables, and Graphs

FIG. 1 illustrates an example system architecture 100 that can facilitate time-series telemetry data compression, in accordance with an embodiment of this disclosure. System architecture 100 comprises computer 102A, computer 102B, computer 102C, communications network 104, and server 106. In turn, computer 102A comprises time-series telemetry data compression component 108A; computer 102B comprises time-series telemetry data compression component 108B; computer 102C comprises time-series telemetry data compression component 108C; and server 106 comprises time-series telemetry data compression component 108D.

Figure 13:
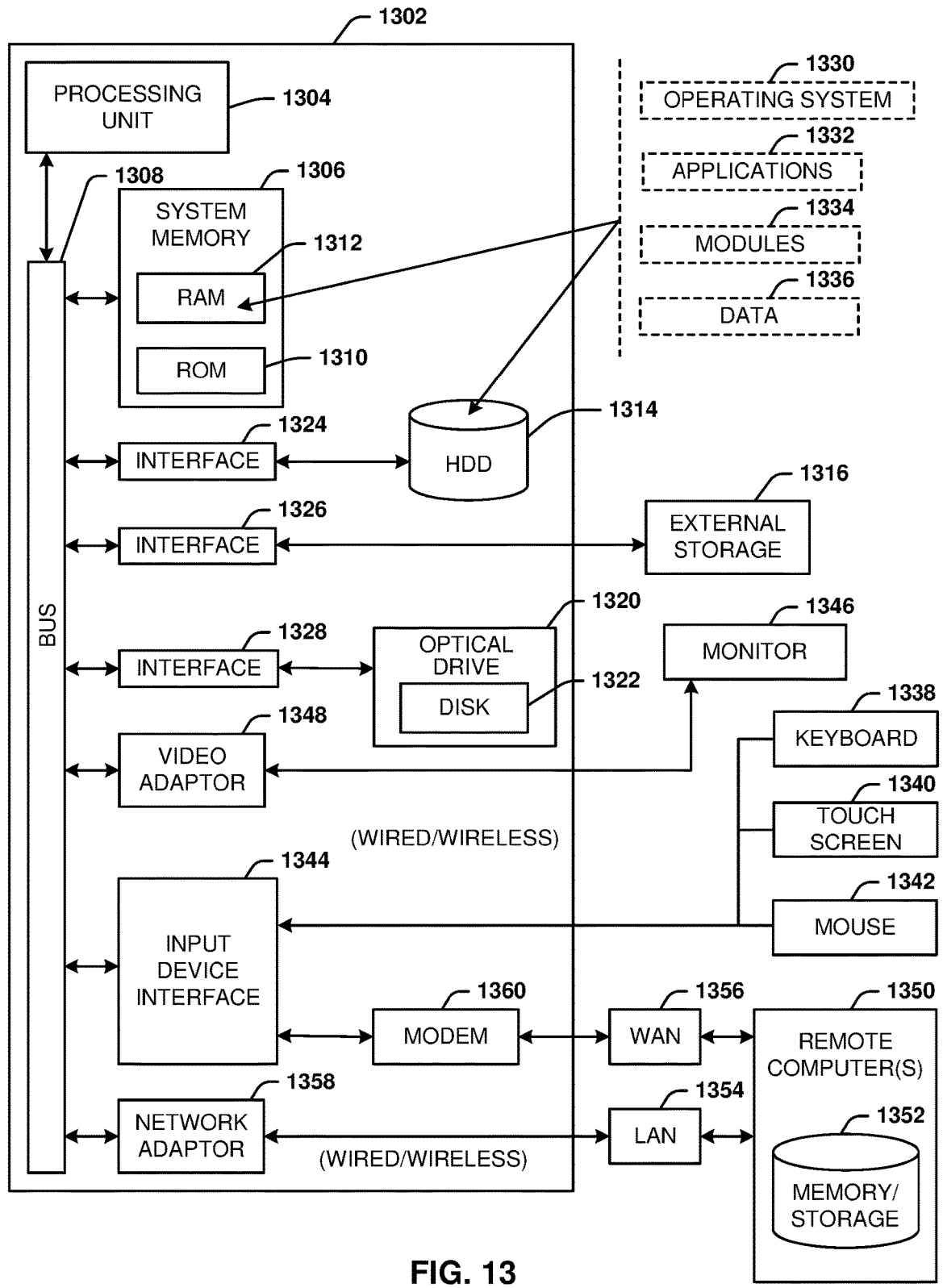
FIG. 13 illustrates an example block diagram of a computer operable to execute an embodiment of this disclosure.

Each of computer 102A, computer 102B, computer 102C, and server 106 can be implemented with part(s) of computing environment 1300 of FIG. 13. Communications network 104 can comprise a computer communications network, such as the Internet.

Figure 12:
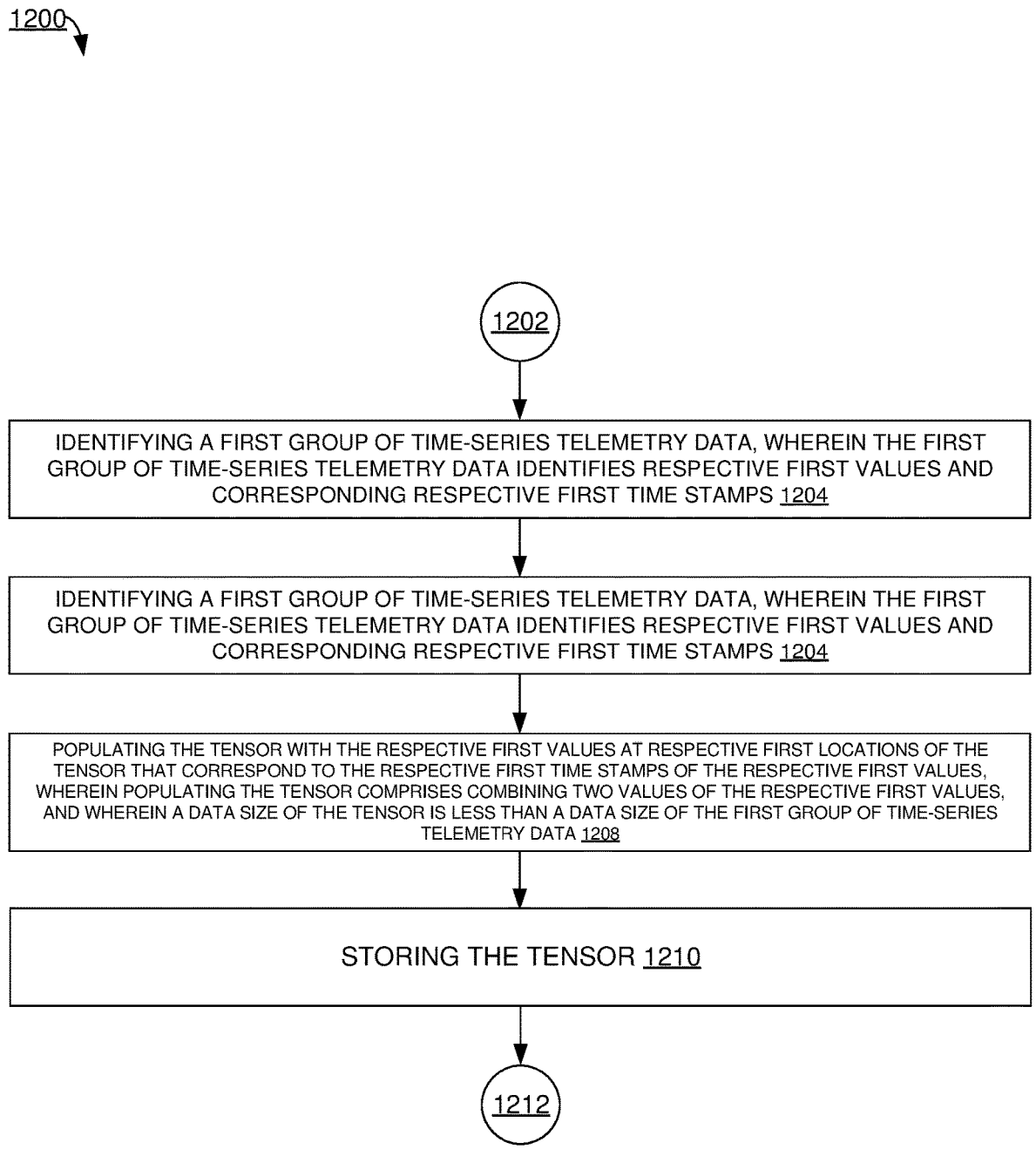
FIG. 12 illustrates another example process flow for time-series telemetry data compression, in accordance with an embodiment of this disclosure.

In some examples, each of time-series telemetry data compression component 108A, time-series telemetry data compression component 108B, time-series telemetry data compression component 108C, and time-series telemetry data compression component 108D can implement part(s) of the process flows of FIGS. 10-12 to facilitate time-series telemetry data compression.

Computer 102A, computer 102B, and computer 102C can generate time-series telemetry data about their operation (e.g., processor utilization or memory utilization). This time-series telemetry data can be compressed by time-series telemetry data compression component 108A, time-series telemetry data compression component 108B, and time-series telemetry data compression component 108C, respectively, and transmitted to server 106 via communications network 104.

Server 106 can receive this compressed time-series telemetry data, and use time-series telemetry data compression component 108D to process this data, such as by using it to determine whether each of computer 102A, computer 102B, and computer 102C are operating correctly. In some examples, time-series telemetry data compression component 108D decompresses the received compressed data. In other examples, time-series telemetry data compression component 108D can use the data in its compressed form to determine whether computers ae operating correctly.

It can be appreciated that system architecture 100 is one example system architecture for time-series telemetry data compression, and that there can be other system architectures that facilitate time-series telemetry data compression.

Figure 2:
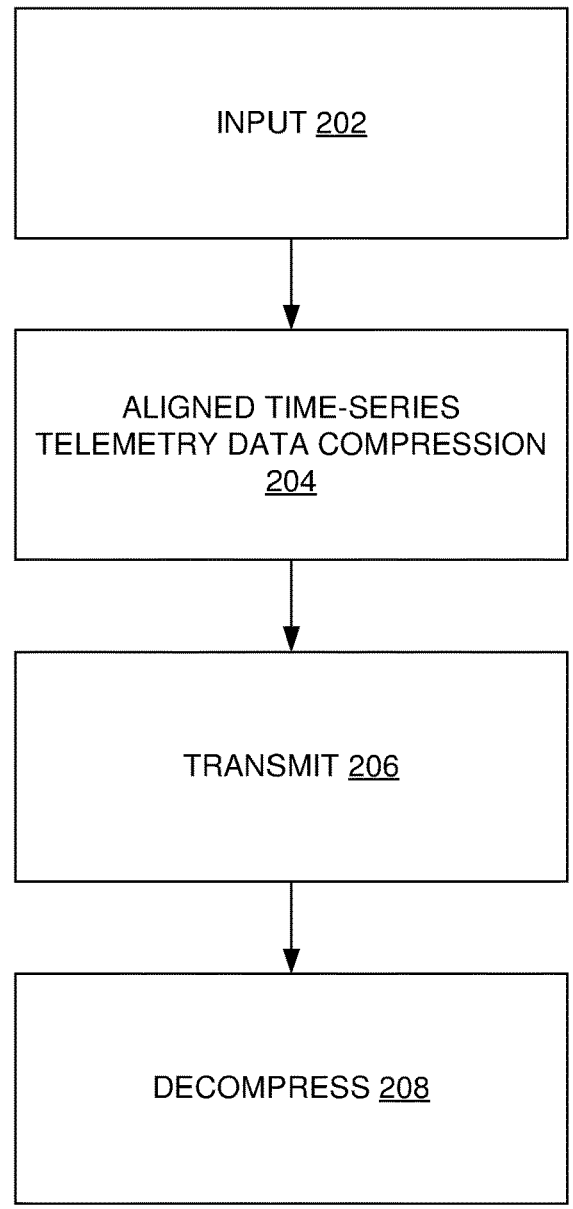
FIG. 2 illustrates an example system architecture that can facilitate time-series telemetry data compression according to aligned time series tensors, in accordance with an embodiment of this disclosure.

FIG. 2 illustrates an example system architecture 200 that can facilitate time-series telemetry data compression according to aligned time series tensors, in accordance with an embodiment of this disclosure. In some examples, system architecture 200 can be implemented by time-series telemetry data compression component 108A, time-series telemetry data compression component 108B, time-series telemetry data compression component 108C, and/or time-series telemetry data compression component 108D of FIG. 1.

Input 202 can comprise time-series telemetry data generated by one or more of computer 102A, computer 102B, and/or computer 102C of FIG. 1. This input data can be operated on by aligned time-series data compression 204 to compress it, where it can be transmitted at transmit 206 (such as to server 106 of FIG. 1), and decompressed with decompress 208 (such as by time-series telemetry data compression component 108).

In some examples, both system architecture 200 and system architecture 200 of FIG. 2 can facilitate time-series telemetry data compression.

Figure 3:
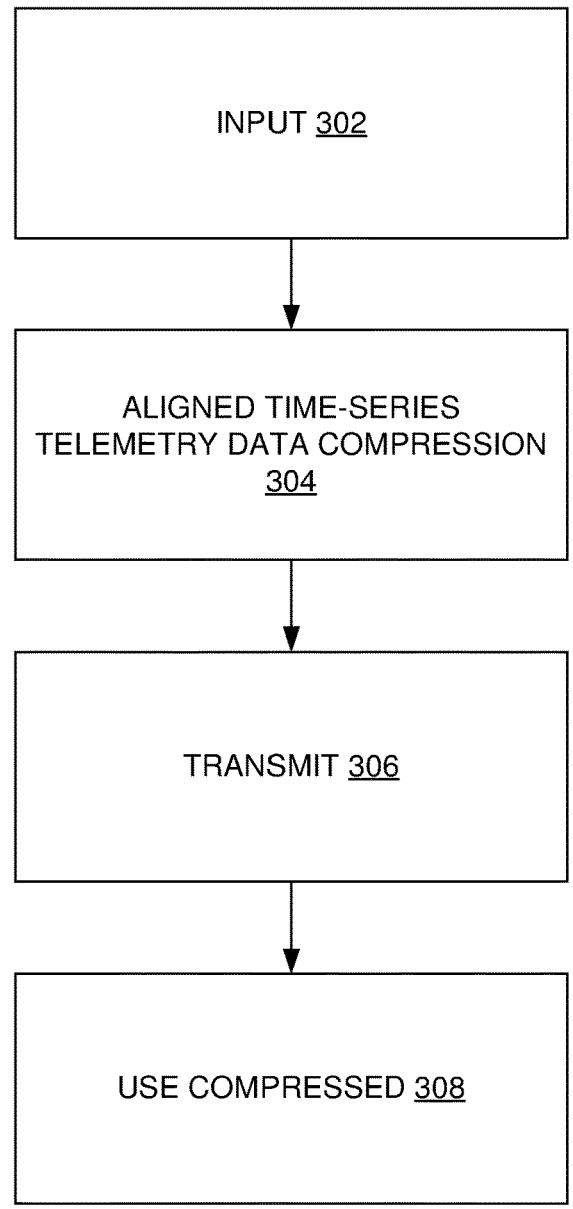
FIG. 3 illustrates an example system architecture that can facilitate time-series telemetry data compression according to aligned time series tensors, and where compressed data is used for data science operations, in accordance with an embodiment of this disclosure.

FIG. 3 illustrates an example system architecture 300 that can facilitate time-series telemetry data compression according to aligned time series tensors, and where compressed data is used for data science operations, in accordance with an embodiment of this disclosure. In some examples, system architecture 300 can be implemented by time-series telemetry data compression component 108A, time-series telemetry data compression component 108B, time-series telemetry data compression component 108C, and/or time-series telemetry data compression component 108D of FIG. 1.

Input 302 can be similar to input 202 of FIG. 2. This input data can be operated on by aligned time-series data compression 304, which can be similar to aligned time-series data compression 204. The compressed data can be transmitted at transmit 306 (which can be similar to transmit 206). The compressed data can be operated on without decompression, at use compressed 308.

That is, in contrast to decompressing the data before using it after transmission, such as in FIG. 2, in some examples, such as depicted in FIG. 3, the compressed data can be used without decompressing it.

Figure 4:
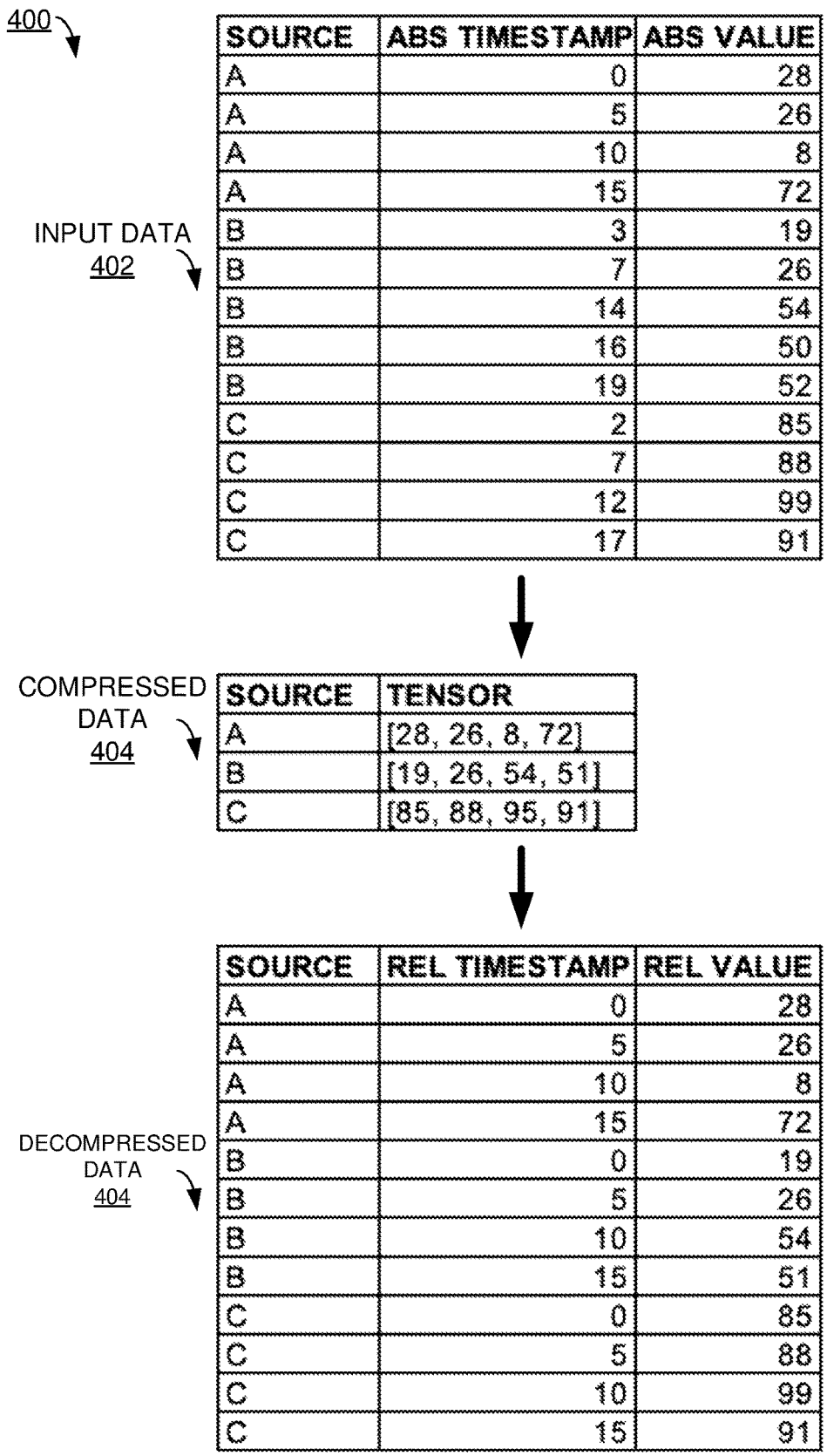
FIG. 4 illustrates an example of compression and decompression that can facilitate time-series telemetry data compression according to aligned time series tensors, in accordance with an embodiment of this disclosure.

FIG. 4 illustrates an example 400 of compression and decompression that can facilitate time-series telemetry data compression according to aligned time series tensors, in accordance with an embodiment of this disclosure. In some examples, example 400 can be implemented by time-series telemetry data compression component 108A, time-series telemetry data compression component 108B, time-series telemetry data compression component 108C, and/or time-series telemetry data compression component 108D of FIG. 1.

System architecture 400 comprises input data 402, compressed data 404, and decompressed data 406.

Input data 402 stores pairs of data values and corresponding timestamps, for multiple sources—sources A, B, and C. These timestamps can be irregular (e.g., not spaced by a fixed distance, such as 1 unit). Input data 402 can be compressed to compressed data 404 by creating tensors.

In a tensor, the timestamp is implied by a data value's position within the tensor (e.g., the first data value in a tensor can correspond to timestamp 0, and the second data value can correspond to timestamp 5). This can save data by eliminating storing a timestamp.

To do this, the timestamps can be aligned. Whereas previously, in input data 402, timestamps could be of any integer value, here they are fixed values—e.g., 0 (which covers data values between timestamps 0 and 4), 5 (which covers data values between timestamps 5 and 9), 10, 15.

As discussed below, where one data source has multiple data values within one of these timestamp ranges, those values can be combined. Take for example the B values, where there is data value 50 at timestamp 16 and data value 52 at timestamp 19. For the timestamps from 15-19, which get assigned to the implied timestamp value of 15 in the tensor, these data values can be averaged, for a value of 51.

Compressed data 404 can be decompressed to produce decompressed data 406. Since the compression is lossy, it can be that decompressed data 406 is not identical to input data 402. For example, for source B, input data 402 stores data value 50 at timestamp 15 and data value 52 at timestamp 19. Decompressed data 406 lacks these B values, but instead stores data value 51 at timestamp 15.

Using system architecture 400, tabular data input can be compressed, to a very small memory footprint for telemetry, then decompressed into tabular format in the destination database, or kept as-is (that is, tensor format) in the destination database.

In an example, there are 5,000,000 rows of data, corresponding to ~300 devices within a computing cluster, for 5 different sensor attributes (1 million rows of data per attribute, ~8 hours of readings). In this example, each univariate time series attribute can be subjected to compression according to the present techniques. Application of compression can lead to a >13-fold reduction in file size when applied to a 271 megabyte (MB) CSV format file containing the 5,000,000 rows of original telemetry data to provide a 21 MB file of the aligned telemetry time series tensors for the 5 attributes of the ~300 devices. Thus, the data can be compressed to 4% of its original size by applying the present techniques for compression.

In another example, there are 5,000,000 rows of data, corresponding to ~300 devices within a computing cluster, for 5 different sensor attributes (1 million rows of data per attribute, ~8 hours of readings). In this example, each univariate time series attribute can be subjected to sparse compression according to the present techniques. Application of sparse compression can lead to a >300-fold reduction in file size when applied to a 271 MB CSV format file containing the 5,000,000 rows of original telemetry data to provide an 473 KB file of the aligned telemetry time series tensors for the 5 attributes of the ~300 devices. Thus, the data can be compressed to 0.3% of its original size by applying the present techniques for sparse compression In another example, there are 100,000,000 rows of telemetry data, corresponding to ~300 devices within a computing cluster, for one sensor attribute (100 million rows of data per attribute, ~21 days of readings). In this example, each univariate time series attribute can be subjected to compression according to the present techniques. Application of compression can lead to an >8-fold reduction in file size when applied to a 3.53 GB CSV format file containing the 100,000,000 rows of original telemetry data to provide a 464 MB file of the aligned telemetry time series tensors for the single attribute of the ~300 devices. Thus, the data can be compressed to 9% of its original size by applying the present techniques for compression In another example, there are 100,000,000 rows of telemetry data, corresponding to ~300 devices within a computing cluster, for one sensor attribute (100 million rows of data per attribute, ~21 days of readings). In this example, each univariate time series attribute can be subjected to sparse compression according to the present techniques. Application of sparse compression can lead to a >30-fold reduction in file size when applied to a 3.53 GB CSV format file containing the 100,000,000 rows of original telemetry data to provide a 123 MB file of the aligned telemetry time series tensors for the single attribute of the ~300 devices. Thus, the data can be compressed to 3% of its original size by applying the present techniques for sparse compression.

Figure 5:
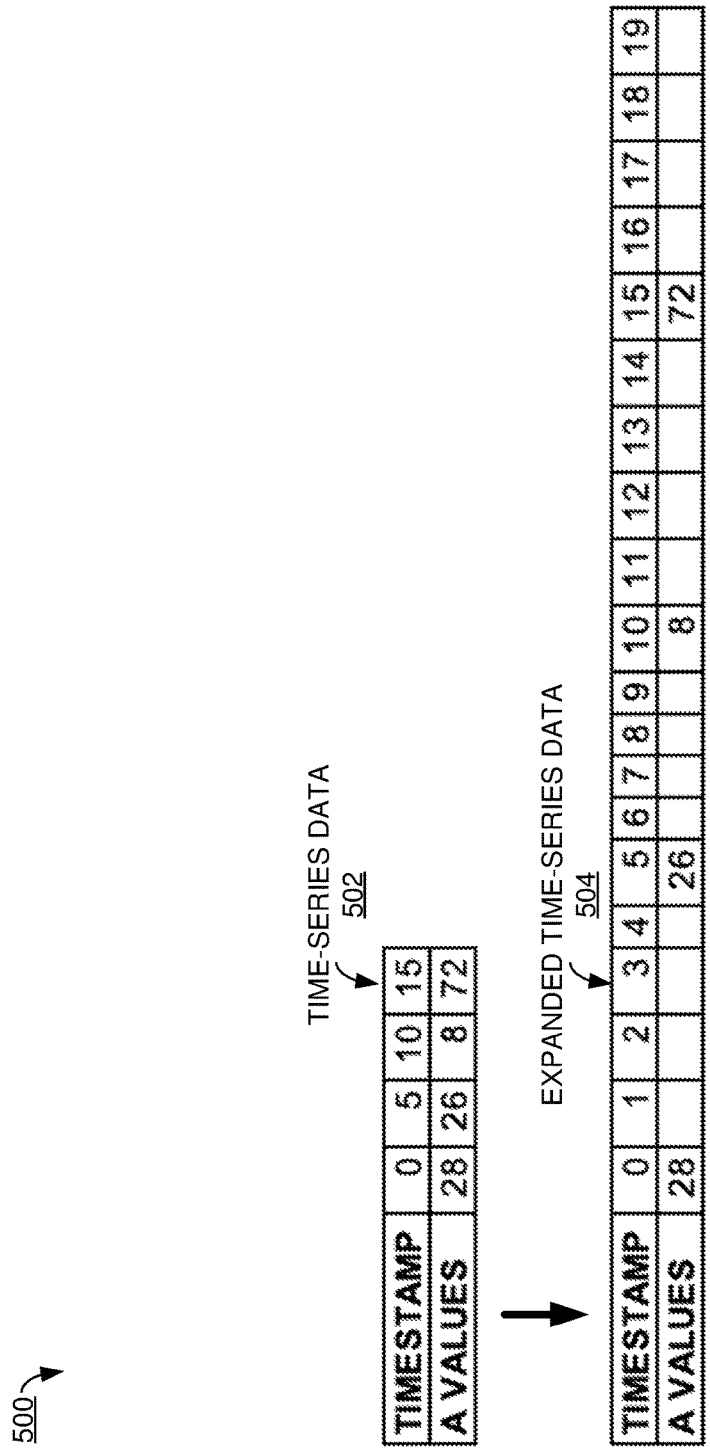
FIG. 5 illustrates an example compression step can facilitate expanding time-series data for producing an aligned time series tensor, for time-series telemetry data compression, in accordance with an embodiment of this disclosure.

FIG. 5 illustrates an example compression step 500 that can facilitate expanding time-series data for producing an aligned time series tensor, for time-series telemetry data compression, in accordance with an embodiment of this disclosure. In some examples, compression step 500 can be implemented as part of generating compressed data 404 from input data 402 for values from source A.

Compression step 500 comprises taking time-series data 502 and transforming it to expanded time-series data 504. This can involve creating a data structure for expanded time-series data 504 that contains more timestamps than time-series data 502, and then populating the data values of time-series data 502 into expanded time-series data 504.

In the example of FIG. 5, the timestamps of time-series data 502 are the same as the timestamps for a resulting tensor (e.g., a tensor in compressed data 404 of FIG. 4), so this can comprise lossless compression to transform the data into a tensor.

In the examples of FIGS. 5-9, the techniques temporarily expand the dimensionality of a time series and then use a convolutional approach to create the aligned time series tensors, resulting in a very small memory footprint for telemetry applications.

Figure 6:
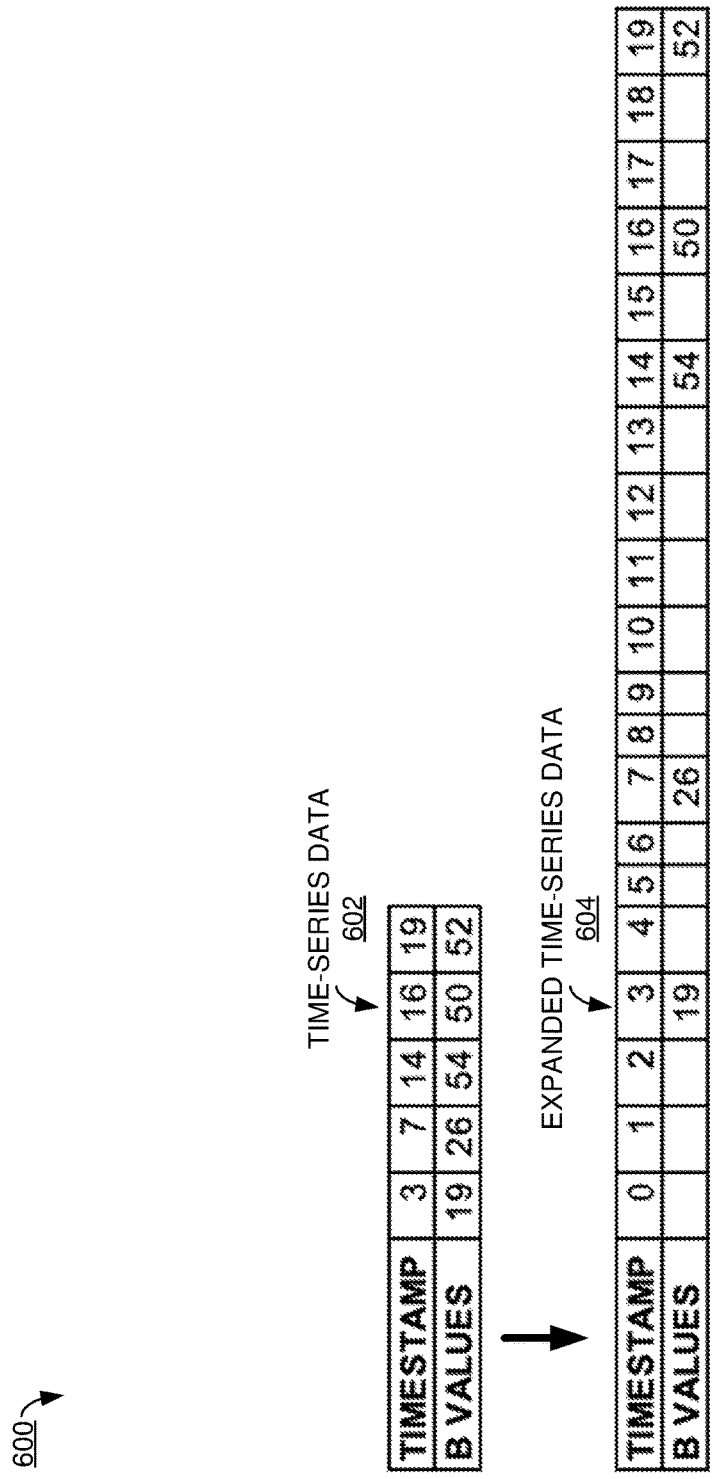
FIG. 6 illustrates another example compression step that can facilitate expanding time-series data for producing an aligned time series tensor, for time-series telemetry data compression, in accordance with an embodiment of this disclosure.

FIG. 6 illustrates another example compression step 600 that can facilitate expanding time-series data for producing an aligned time series tensor, for time-series telemetry data compression, in accordance with an embodiment of this disclosure. In some examples, compression step 600 can be implemented as part of generating compressed data 404 from input data 402 for values from source B.

Compression step 600 comprises taking time-series data 602 and transforming it to expanded time-series data 604. This can be performed in a similar manner as described with respect to FIG. 5.

In the example of FIG. 6, the timestamps of time-series data 602 are different from timestamps for a resulting tensor (e.g., a tensor in compressed data 404 of FIG. 4), so this can comprise lossy compression to transform the data into a tensor, where the exact timestamp values are lost. Furthermore, since two data values will be combined to be stored in the same timestamp bucket (e.g., from timestamps 15-19), this can also comprise lossy compression where the original values are not recovered via decompression.

Figure 7:
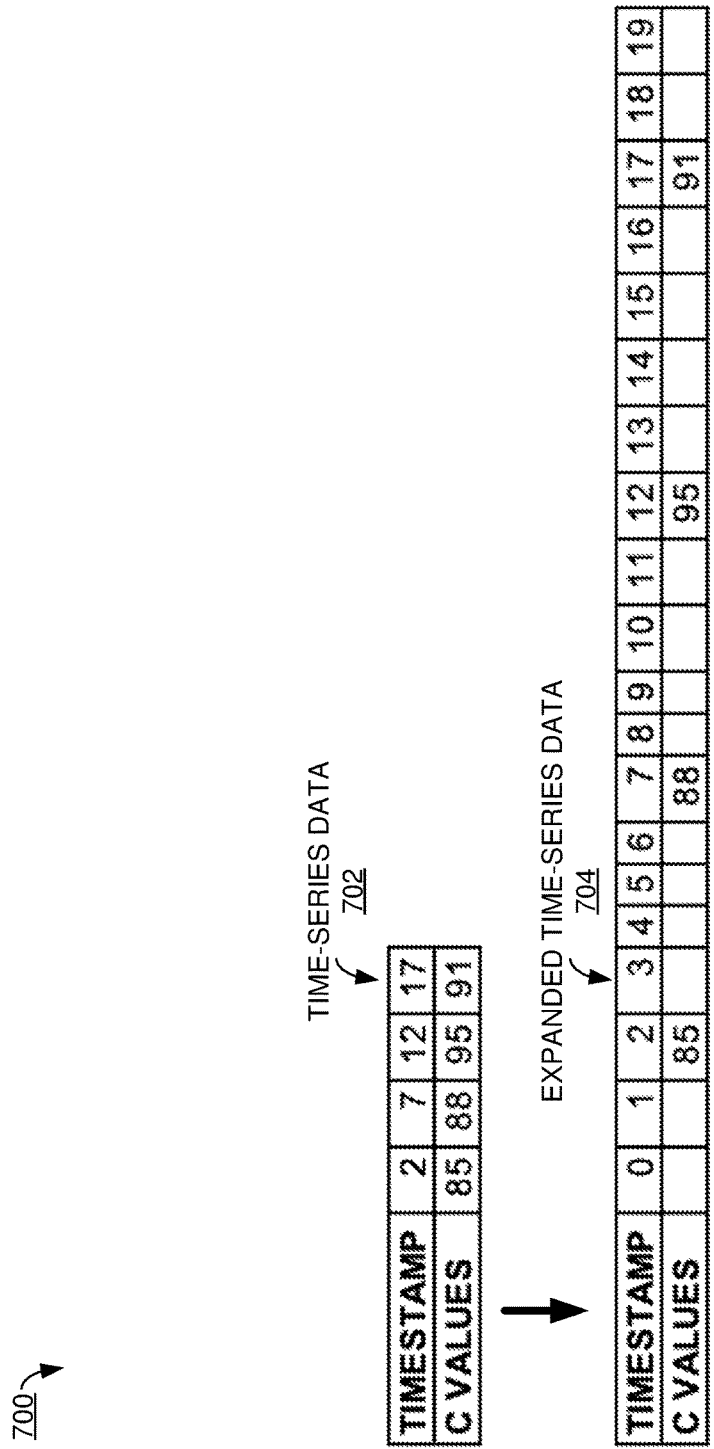
FIG. 7 illustrates another example compression step that can facilitate expanding time-series data for producing an aligned time series tensor, for time-series telemetry data compression, in accordance with an embodiment of this disclosure.

FIG. 7 illustrates another example compression step 700 that can facilitate expanding time-series data for producing an aligned time series tensor, for time-series telemetry data compression, in accordance with an embodiment of this disclosure. In some examples, compression step 700 can be implemented as part of generating compressed data 404 from input data 402 for values from source C.

Compression step 700 comprises taking time-series data 702 and transforming it to expanded time-series data 704. This can be performed in a similar manner as described with respect to FIG. 5.

In the example of FIG. 7, the timestamps of time-series data 602 are different from timestamps for a resulting tensor (e.g., a tensor in compressed data 404 of FIG. 4), so this can comprise lossy compression to transform the data into a tensor, where the exact timestamp values are lost. However, in contrast to FIG. 6, there is not a situation where two data values will be combined to be stored in the same timestamp bucket (e.g., from timestamps 15-19), so the original data values can be losslessly recovered as part of decompression.

Figure 8:
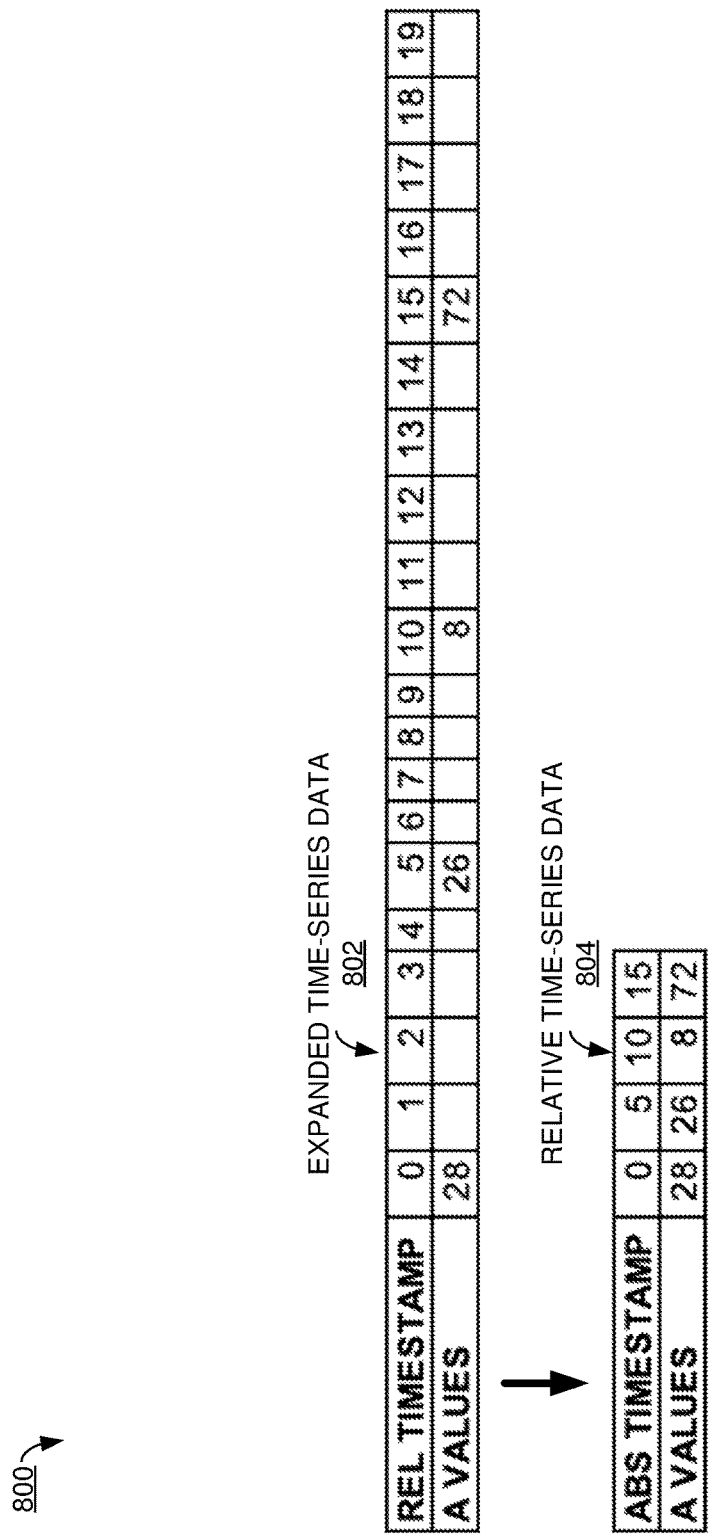
FIG. 8 illustrates another example compression step that can facilitate reducing expanded time-series data to a time-series data with relative timestamps, for time-series telemetry data compression, in accordance with an embodiment of this disclosure.

FIG. 8 illustrates another example compression step 800 that can facilitate reducing expanded time-series data to a time-series data with relative timestamps, for time-series telemetry data compression, in accordance with an embodiment of this disclosure. In some examples, compression step 800 can be implemented as part of reducing the expanded time series data of source A from FIG. 5 to relative time series data.

Compression step 800 comprises taking expanded time-series data 802 and transforming it to relative time-series data 804. Expanded time-series data 802 can be similar to expanded time-series data 504 of FIG. 5. To produce relative time-series data 804, values from expanded time-series data 802 can be bucketed. Values for timestamps 0-4, 5-9, 10-14, and 15-19 can be combined, and then stored for timestamps 0, 5, 10, and 15, respectively. In this example, there are not two data values within one bucket (like with the B values of FIG. 4), so values are not combined here.

Figure 9:
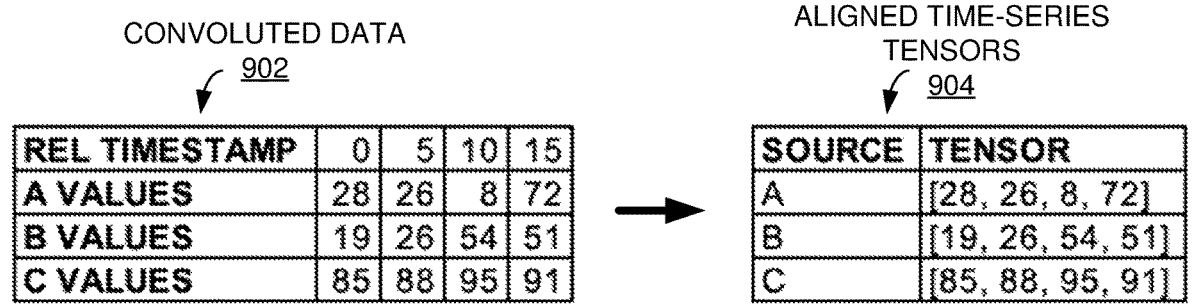
FIG. 9 illustrates another example compression step that can facilitate creating aligned time-series tensors from reduced tensors, for time-series telemetry data compression, in accordance with an embodiment of this disclosure.

FIG. 9 illustrates another example compression step 900 that can facilitate creating aligned time-series tensors from reduced tensors, for time-series telemetry data compression, in accordance with an embodiment of this disclosure. Compression step 900 can use expanded time-series data 504 of FIG. 5, expanded time-series data 604 of FIG. 6, and expanded time-series data 704 of FIG. 7 to produce aligned time-series tensors.

Compression step 900 comprises transforming convoluted data 902 (where convolution can generally comprise an operation on two functions that produces a third function that expresses a relationship between those two functions) into aligned time-series tensors 904. Convoluted data 902 can be similar to relative time-series data 804 of FIG. 8 (which is performed on A values of FIG. 4, and where similar operations are performed on the B values and C values).

Convoluted data 902 can be transformed into aligned time-series tensors 904, where timestamps from convoluted data 902 are omitted from aligned time-series tensors 904. Rather, a timestamp for a data value in a tensor is indicated by that data value's position within the tensor (e.g., a data value at the second position within a tensor will be implied to correspond to timestamp 5, and a data value at the third position within a tensor will be implied to correspond to timestamp 10).

Example Process Flows

FIG. 10 illustrates an example process flow 1000 that can facilitate time-series telemetry data compression, in accordance with an embodiment of this disclosure. In some examples, one or more embodiments of process flow 1000 can be implemented by time-series telemetry data compression component 108D of FIG. 1, or computing environment 1300 of FIG. 13.

It can be appreciated that the operating procedures of process flow 1000 are example operating procedures, and that there can be embodiments that implement more or fewer operating procedures than are depicted, or that implement the depicted operating procedures in a different order than as depicted. In some examples, process flow 1000 can be implemented in conjunction with one or more embodiments of one or more of process flow 1100 of FIG. 11, and/or process flow 1200 of FIG. 12.

Process flow 1000 begins with 1002, and moves to operation 1004. Operation 1004 depicts identifying a first group of time-series telemetry data that represents performance metrics of a computing device, wherein the first group of time-series telemetry data identifies respective first values and corresponding respective first timestamps, wherein respective first numerical distances between the respective first timestamps are irregular. In some examples, the first group of time-series telemetry data can be input data 402 of FIG. 4. The respective first numerical distances between the respective first timestamps can be irregular because they are not evenly spaced, (e.g., the timestamps for B are 3, 7, 14, 16, 19 instead of 0, 5, 10, 15, 20).

In other examples, the first group of time-series telemetry data can be similar to time-series data 502 of FIG. 5, time-series data 602 of FIG. 6, and/or time-series data 702 of FIG. 7.

After operation 1004, process flow 1000 moves to operation 1006.

Operation 1006 depicts creating a second group of time-series telemetry data that identifies second timestamps, wherein respective second numerical distances between respective second timestamps of the second timestamps are regular. Using the examples of FIGS. 5-7, the second group of time-series telemetry data can be expanded time-series data 504, expanded time-series data 604, and/or expanded time-series data 704. At operation 1006, it can be that the values (e.g., "A values" of expanded time-series data 504) are not yet populated, or are populated with values of zero. This can also be expressed as, respective third locations of the second group of time-series telemetry data are populated with a value of zero, and wherein the respective third locations differ from the respective first locations.

The second timestamps can be regular because they are equidistant (e.g., timestamps of expanded time-series data 504 are all spaced one unit apart –0, 1, 2, 3, 4, etc.).

After operation 1006, process flow 1000 moves to operation 1008.

Operation 1008 depicts populating the second group of time-series telemetry data with the respective first values at respective first locations of the second group of time-series telemetry data that correspond to the respective first timestamps of the respective first values. Using the example of FIG. 5, this can comprise taking the A values from time-series data 502 (which are 28, 26, 8, 72) and populating them in expanded time-series data 504 at corresponding time values (the time values of 0, 5, 10, and 15).

After operation 1008, process flow 1000 moves to operation 1010.

Operation 1010 depicts creating a tensor that identifies third timestamps, wherein a number of the third timestamps is less than a number of the second timestamps, and wherein respective third numerical distances between respective third timestamps of the third timestamps are regular. This can be one of the tensors in compressed data 404 of FIG. 4, before that tensor is populated with values. In contrast to input data 402, where time values are explicitly stored as part of the data, a tensor can represent time values implicitly and based on a data value's position within the tensor. That is, where a tensor stores four data values, the first data value can correspond to a time value of 0, the second data value can correspond to a time value of 5, the third data value can correspond to a time value of 10, and the fourth data value can correspond to a time value of 15.

Stated another way, in some examples, the respective locations of the tensor indicate respective time values of the third timestamps. That is, rather than storing values of timestamps (as in input data 402), a data value's location within the tensor can indicate its corresponding timestamp.

In the example of operation 1010, a number of the third timestamps is less than a number of the second timestamps. That is, using the example of B values in FIG. 4, there are five B values in input data 402, and only four B values represented in compressed data 404.

After operation 1010, process flow 1000 moves to operation 1012.

Operation 1012 depicts populating the tensor with the respective first values at respective second locations of the tensor that correspond to the respective first timestamps of the respective first values, wherein populating the tensor comprises combining two values of the respective first values, and wherein a data size of the tensor is less than a data size of the first group of time-series telemetry data.

Using the B values example of FIG. 4, the tensor can store a combination of the two B values with timestamps between 15 and 20—that is, value 50 with timestamp 16, and data value 52 with timestamp 19. Here, a simple average of 52 and 50 is taken to produce 51, which is stored in the B values tensor of compressed data 404.

After operation 1012, process flow 1000 moves to operation 1014.

Operation 1014 depicts performing a data science operation on the tensor to produce a first result, wherein the first result is within a specified threshold value of a second result of performing the data science operation on the first group of time-series telemetry data. That is, while the compression of process flow 1000 can be lossy, it can be that the lossy data is still suitable for data science purposes of evaluating performance metrics of the computing device, because a result of performing the data science operation on the lossy data is similar enough to a result of performing that data science operation on the input data so as to be usable.

In some examples, operation 1014 comprises expanding the tensor to a third group of time-series telemetry data, and performing the data science operation on the third group of time-series telemetry data. That is, the tensor can be decompressed (e.g., returned to a form similar to the first group of time-series telemetry data, which stores pairs of data values and corresponding timestamps) before performing a data science operation on it.

In some examples, a first value of the first values of the second group of time-series telemetry data differs from a second value of the third group of time-series telemetry data. That is, where the compression is lossy, decompressing the tensor does not recreate an exact copy of the input data.

In some examples, operation 1014 comprises performing the data science operation on the tensor, independently of decompressing the tensor. That is, the data science operation can be performed on the compressed tensor, without first decompressing it.

In some examples, the computing device is a first computing device, and operation 1014 comprises transmitting the tensor from the first computing device and to a second computing device after populating the tensor, wherein the second computer performs the data science operation on the tensor, and wherein the second computer monitors system metrics of the first computer based on the tensor. Similar to the example of FIG. 1, performance metrics can be gathered and compressed by computer 102A, computer 102B, and computer 102C, then transmitted to server 106, where the metrics are evaluated.

After operation 1014, process flow 1000 moves to 1016, where process flow 1000 ends.

FIG. 11 illustrates another example process flow 1100 that can facilitate time-series telemetry data compression, in accordance with an embodiment of this disclosure. In some examples, one or more embodiments of process flow 1100 can be implemented by time-series telemetry data compression component 108D of FIG. 1, or computing environment 1300 of FIG. 13.

It can be appreciated that the operating procedures of process flow 1100 are example operating procedures, and that there can be embodiments that implement more or fewer operating procedures than are depicted, or that implement the depicted operating procedures in a different order than as depicted. In some examples, process flow 1100 can be implemented in conjunction with one or more embodiments of one or more of process flow 1000 of FIG. 10, and/or process flow 1200 of FIG. 12.

Process flow 1100 begins with 1102, and moves to operation 1104. Operation 1104 depicts identifying a first group of time-series telemetry data, wherein the first group of time-series telemetry data identifies respective first values and corresponding respective first timestamps, wherein respective first numerical distances between the respective first timestamps are irregular. In some examples, operation 1104 can be implemented in a similar manner as operation 1004 of FIG. 10.

After operation 1104, process flow 1100 moves to operation 1106.

Operation 1106 depicts creating a tensor that identifies second timestamps, wherein respective second numerical distances between respective third timestamps of the third timestamps are regular. In some examples, operation 1106 can be implemented in a similar manner as operation 1110 of FIG. 10.

Timestamps for the first group of time-series telemetry data and tensor can be identified as follows. In some examples, the first group of time-series telemetry data stores values of the first timestamps. That is, timestamp values can be stored such as with input data 402 of FIG. 4 (in contrast to a data value's timestamp being implied based on its position within the data set).

This can also be expressed as follows. In some examples, the first group of time-series telemetry data identifies respective first values and corresponding respective first timestamps. In some examples, the respective first locations of the tensor indicate respective timestamps of the third timestamps, and wherein the tensor omits storing respective first values of the respective third timestamps.

After operation 1106, process flow 1100 moves to operation 1108.

Operation 1108 depicts populating the tensor with the respective first values at respective first locations of the tensor that correspond to the respective first timestamps of the respective first values, wherein populating the tensor comprises combining two values of the respective first values, and wherein a data size of the tensor is less than a data size of the first group of time-series telemetry data. In some examples, operation 1108 can be implemented in a similar manner as operation 1012 of FIG. 10.

In some examples, operation 1108 comprises creating a second group of time-series telemetry data that identifies third timestamps, wherein respective third numerical distances between respective third timestamps of the third timestamps are regular; and populating the second group of time-series telemetry data with the respective first values at respective first locations of the second group of time-series telemetry data that correspond to the respective first timestamps of the respective first values, wherein populating the tensor comprises populating the tensor with the respective first values as stored in the second group of time-series telemetry data. That is, input data can be expanded before populating a tensor, such as in FIG. 5, where time-series data 502 is expanded into expanded time-series data 504.

In some examples, populating the tensor with the respective first values comprises performing lossy compression on the respective first values. That is, where two values are combined for populating in the tensor (such as with the example of B values of FIG. 4), this can be a lossy form of compression where the original data is inaccessible via decompression.

In some examples, populating the tensor with the respective first values comprises performing a convolution on the respective first values.

After operation 1108, process flow 1100 moves to operation 1110.

Operation 1110 depicts performing a defined data processing operation on the tensor to produce a first result, wherein the first result is within a predetermined threshold value of a second result of performing the defined data processing on the first group of time-series telemetry data. In some examples, operation 1110 can be implemented in a similar manner as operation 1014 of FIG. 10.

After operation 1110, process flow 1100 moves to 1112, where process flow 1100 ends.

FIG. 12 illustrates another example process flow 1200 that can facilitate cost-optimized recommendations from inaccurate event logs, in accordance with an embodiment of this disclosure. In some examples, one or more embodiments of process flow 1200 can be implemented by time-series telemetry data compression component 108D of FIG. 1, or computing environment 1300 of FIG. 13.

It can be appreciated that the operating procedures of process flow 1200 are example operating procedures, and that there can be embodiments that implement more or fewer operating procedures than are depicted, or that implement the depicted operating procedures in a different order than as depicted. In some examples, process flow 1200 can be implemented in conjunction with one or more embodiments of one or more of process flow 1000 of FIG. 10, and/or process flow 1100 of FIG. 11.

Process flow 1200 begins with 1202, and moves to operation 1204. Operation 1204 depicts identifying a first group of time-series telemetry data, wherein the first group of time-series telemetry data identifies respective first values and corresponding respective first timestamps. In some examples, operation 1204 can be implemented in a similar manner as operation 1004 of FIG. 10.

After operation 1204, process flow 1200 moves to operation 1206.

Operation 1206 depicts creating a tensor that identifies second timestamps. In some examples, operation 1206 can be implemented in a similar manner as operation 1010 of FIG. 10.

In some examples, respective first numerical distances between the respective first timestamps are irregular, and respective second numerical distances between respective second timestamps of the second timestamps are regular.

After operation 1206, process flow 1200 moves to operation 1208.

Operation 1208 depicts populating the tensor with the respective first values at respective first locations of the tensor that correspond to the respective first timestamps of the respective first values, wherein populating the tensor comprises combining two values of the respective first values, and wherein a data size of the tensor is less than a data size of the first group of time-series telemetry data. In some examples, operation 1208 can be implemented in a similar manner as operation 1012 of FIG. 10.

In some examples, operation 1208 comprises creating a second group of time-series telemetry data that identifies third timestamps, wherein respective third numerical distances between respective third timestamps of the third timestamps are regular; and populating the second group of time-series telemetry data with the respective first values at respective first locations of the second group of time-series telemetry data that correspond to the respective first timestamps of the respective first values, wherein populating the tensor comprises populating the tensor with the respective first values as stored in the second group of time-series telemetry data.

After operation 1208, process flow 1200 moves to operation 1210.

Operation 1210 depicts storing the tensor. For example, the tensor can be stored in a computer memory of server 106 of FIG. 1 for later processing to evaluate performance metrics of computer 102A, computer 102B, and/or computer 102C.

In some examples, operation 1210 comprises performing a data science operation on the tensor to produce a first result, wherein the first result is within a predetermined threshold value of a second result of performing the data science operation on the first group of time-series telemetry data. This can be implemented in a similar manner as operation 1014 of FIG. 10.

In some examples, performing the data science operation on the tensor to produce the first result comprises expanding the tensor to a second group of time-series telemetry data, performing the data science operation on the second group of time-series telemetry data. That is, the tensor can be decompressed (e.g., returned to a form similar to the first group of time-series telemetry data, which stores pairs of data values and corresponding timestamps) before performing a data science operation on it.

In some examples, a first value of the first values of the first group of time-series telemetry data differs from a second value of the second group of time-series telemetry data. That is, lossy compression can be implemented in creating the tensor, which is then decompressed to the second group of time-series telemetry data.

After operation 1210, process flow 1200 moves to 1212, where process flow 1200 ends.

Example Operating Environment

In order to provide additional context for various embodiments described herein, FIG. 13 and the following discussion are intended to provide a brief, general description of a suitable computing environment 1300 in which the various embodiments of the embodiment described herein can be implemented.

For example, parts of computing environment 1300 can be used to implement one or more embodiments of computer 102A, computer 102B, computer 102C, or server 106 of FIG. 1.

In some examples, computing environment 1300 can implement one or more embodiments of the process flows of FIGS. 10-12 to facilitate time-series telemetry data compression.

While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the various methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 13, the example environment 1300 for implementing various embodiments described herein includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi-processor architectures can also be employed as the processing unit 1304.

The system bus 1308 can be any of several types of bus structure that can further interconnect to a memory bus (with or without a memory controller), a peripheral bus, and a local bus using any of a variety of commercially available bus architectures. The system memory 1306 includes ROM 1310 and RAM 1312. A basic input/output system (BIOS) can be stored in a nonvolatile storage such as ROM, erasable programmable read only memory (EPROM), EEPROM, which BIOS contains the basic routines that help to transfer information between elements within the computer 1302, such as during startup. The RAM 1312 can also include a high-speed RAM such as static RAM for caching data.

The computer 1302 further includes an internal hard disk drive (HDD) 1314 (e.g., EIDE, SATA), one or more external storage devices 1316 (e.g., a magnetic floppy disk drive (FDD) 1316, a memory stick or flash drive reader, a memory card reader, etc.) and an optical disk drive 1320 (e.g., which can read or write from a CD-ROM disc, a DVD, a BD, etc.). While the internal HDD 1314 is illustrated as located within the computer 1302, the internal HDD 1314 can also be configured for external use in a suitable chassis (not shown). Additionally, while not shown in environment 1300, a solid state drive (SSD) could be used in addition to, or in place of, an HDD 1314. The HDD 1314, external storage device(s) 1316 and optical disk drive 1320 can be connected to the system bus 1308 by an HDD interface 1324, an external storage interface 1326 and an optical drive interface 1328, respectively. The interface 1324 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1302, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. The systems and methods described herein can be implemented utilizing various commercially available operating systems or combinations of operating systems.

Computer 1302 can optionally comprise emulation technologies. For example, a hypervisor (not shown) or other intermediary can emulate a hardware environment for operating system 1330, and the emulated hardware can optionally be different from the hardware illustrated in FIG. 13. In such an embodiment, operating system 1330 can comprise one virtual machine (VM) of multiple VMs hosted at computer 1302. Furthermore, operating system 1330 can provide runtime environments, such as the Java runtime environment or the .NET framework, for applications 1332. Runtime environments are consistent execution environments that allow applications 1332 to run on any operating system that includes the runtime environment. Similarly, operating system 1330 can support containers, and applications 1332 can be in the form of containers, which are lightweight, standalone, executable packages of software that include, e.g., code, runtime, system tools, system libraries and settings for an application.

Further, computer 1302 can be enabled with a security module, such as a trusted processing module (TPM). For instance, with a TPM, boot components hash next in time boot components, and wait for a match of results to secured values, before loading a next boot component. This process can take place at any layer in the code execution stack of computer 1302, e.g., applied at the application execution level or at the operating system (OS) kernel level, thereby enabling security at any level of code execution.

A user can enter commands and information into the computer 1302 through one or more wired/wireless input devices, e.g., a keyboard 1338, a touch screen 1340, and a pointing device, such as a mouse 1342. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1304 through an input device interface 1344 that can be coupled to the system bus 1308, but can be connected by other interfaces, such as a parallel port, an IEEE 1394 serial port, a game port, a USB port, an IR interface, a BLUETOOTH® interface, etc.

A monitor 1346 or other type of display device can be also connected to the system bus 1308 via an interface, such as a video adapter 1348. In addition to the monitor 1346, a computer typically includes other peripheral output devices (not shown), such as speakers, printers, etc.

The computer 1302 can operate in a networked environment using logical connections via wired and/or wireless communications to one or more remote computers, such as a remote computer(s) 1350. The remote computer(s) 1350 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1352 is illustrated. The logical connections depicted include wired/wireless connectivity to a local area network (LAN) 1354 and/or larger networks, e.g., a wide area network (WAN) 1356. Such LAN and WAN networking environments are commonplace in offices and companies, and facilitate enterprise-wide computer networks, such as intranets, all of which can connect to a global communications network, e.g., the Internet.

When used in a LAN networking environment, the computer 1302 can be connected to the local network 1354 through a wired and/or wireless communication network interface or adapter 1358. The adapter 1358 can facilitate wired or wireless communication to the LAN 1354, which can also include a wireless access point (AP) disposed thereon for communicating with the adapter 1358 in a wireless mode.

When used in a WAN networking environment, the computer 1302 can include a modem 1360 or can be connected to a communications server on the WAN 1356 via other means for establishing communications over the WAN 1356, such as by way of the Internet. The modem 1360, which can be internal or external and a wired or wireless device, can be connected to the system bus 1308 via the input device interface 1344. In a networked environment, program modules depicted relative to the computer 1302 or portions thereof, can be stored in the remote memory/storage device 1352. It will be appreciated that the network connections shown are examples and other means of establishing a communications link between the computers can be used.

When used in either a LAN or WAN networking environment, the computer 1302 can access cloud storage systems or other network-based storage systems in addition to, or in place of, external storage devices 1316 as described above. Generally, a connection between the computer 1302 and a cloud storage system can be established over a LAN 1354 or WAN 1356 e.g., by the adapter 1358 or modem 1360, respectively. Upon connecting the computer 1302 to an associated cloud storage system, the external storage interface 1326 can, with the aid of the adapter 1358 and/or modem 1360, manage storage provided by the cloud storage system as it would other types of external storage. For instance, the external storage interface 1326 can be configured to provide access to cloud storage sources as if those sources were physically connected to the computer 1302.

The computer 1302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

CONCLUSION

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. For instance, when a processor executes instructions to perform "operations", this could include the processor performing the operations directly and/or facilitating, directing, or cooperating with another device or component to perform the operations.

In the subject specification, terms such as "datastore," data storage," "database," "cache," and substantially any other information storage component relevant to operation and functionality of a component, refer to "memory components," or entities embodied in a "memory" or components comprising the memory. It will be appreciated that the memory components, or computer-readable storage media, described herein can be either volatile memory or nonvolatile storage, or can include both volatile and nonvolatile storage. By way of illustration, and not limitation, nonvolatile storage can include ROM, programmable ROM (PROM), EPROM, EEPROM, or flash memory. Volatile memory can include RAM, which acts as external cache memory. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated embodiments of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an ASIC, or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or application programming interface (API) components.

Further, the various embodiments can be implemented as a method, apparatus, or article of manufacture using standard programming and/or engineering techniques to produce software, firmware, hardware, or any combination thereof to control a computer to implement one or more embodiments of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical discs (e.g., CD, DVD . . . ), smart cards, and flash memory devices (e.g., card, stick, key drive . . . ). Of course, those skilled in the art will recognize many modifications can be made to this configuration without departing from the scope or spirit of the various embodiments.

In addition, the word "example" or "exemplary" is used herein to mean serving as an example, instance, or illustration. Any embodiment or design described herein as "exemplary" is not necessarily to be construed as preferred or advantageous over other embodiments or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
identifying a first group of time-series telemetry data that represents performance metrics of a computing device, wherein the first group of time-series telemetry data identifies respective first values and corresponding respective first timestamps, wherein respective first numerical distances between the respective first timestamps are spaced at unequal distances from each other;
creating a second group of time-series telemetry data that identifies second timestamps, wherein respective second numerical distances between respective second timestamps of the second timestamps are spaced at unequal distances from each other;
populating the second group of time-series telemetry data with the respective first values at respective first locations of the second group of time-series telemetry data that correspond to the respective first timestamps of the respective first values;
creating a tensor that identifies third timestamps, wherein a number of the third timestamps is less than a number of the second timestamps, and wherein respective third numerical distances between respective third timestamps of the third timestamps are equidistantly spaced;
populating the tensor with the respective first values at respective second locations of the tensor that correspond to the respective first timestamps of the respective first values, wherein populating the tensor comprises combining two values of the respective first values, and wherein a data size of the tensor is less than a data size of the first group of time-series telemetry data; and performing a data science operation on the tensor to produce a first result that indicates whether the computing device is operating anomalously, wherein the first result is within a specified threshold value of a second result of performing the data science operation on the first group of time-series telemetry data.

2. The system of claim 1, wherein performing the data science operation on the tensor to produce the first result comprises:

expanding the tensor to a third group of time-series telemetry data; and performing the data science operation on the third group of time-series telemetry data.

3. The system of claim 2, wherein a first value of the first values of the second group of time-series telemetry data differs from a second value of the third group of time-series telemetry data.

4. The system of claim 1, wherein the respective locations of the tensor indicate respective time values of the third timestamps.

5. The system of claim 1, wherein respective third locations of the second group of time-series telemetry data are populated with a value of zero, and wherein the respective third locations differ from the respective first locations.

6. The system of claim 1, wherein performing the data science operation on the tensor to produce the first result comprises:

performing the data science operation on the tensor, independently of decompressing the tensor.

7. The system of claim 1, wherein the computing device is a first computing device, and wherein the operations further comprise:

transmitting the tensor from the first computing device and to a second computing device after populating the tensor, wherein the second computing device performs the data science operation on the tensor, and wherein the second computing device monitors system metrics of the first computing device based on the tensor.

8. A method, comprising:

identifying, by a system comprising a processor, a first group of time-series telemetry data, wherein the first group of time-series telemetry data identifies respective first values and corresponding respective first timestamps, wherein at least two respective first numerical distances between the respective first timestamps are different numerical values;

creating, by the system, a tensor that identifies second timestamps, wherein respective second numerical distances between respective third timestamps of the third timestamps are equidistantly spaced;

populating, by the system, the tensor with the respective first values at respective first locations of the tensor that correspond to the respective first timestamps of the respective first values, wherein populating the tensor comprises combining two values of the respective first values, and wherein a data size of the tensor is less than a data size of the first group of time-series telemetry data; and performing, by the system, a defined data processing operation on the tensor to produce a first result that indicates an operating status of a computing device, wherein the first result is within a predetermined threshold value of a second result of performing the defined data processing operation on the first group of time-series telemetry data.

9. The method of claim 8, further comprising:

creating, by the system, a second group of time-series telemetry data that identifies third timestamps, wherein respective third numerical distances between respective third timestamps of the third timestamps are equidistantly spaced; and populating, by the system, the second group of time-series telemetry data with the respective first values at respective first locations of the second group of time-series telemetry data that correspond to the respective first timestamps of the respective first values, wherein populating the tensor comprises populating the tensor with the respective first values as stored in the second group of time-series telemetry data.

10. The method of claim 8, wherein populating the tensor with the respective first values comprises performing lossy compression on the respective first values.

11. The method of claim 8, wherein the first group of time-series telemetry data stores values of the first timestamps.

12. The method of claim 8, wherein the first group of time-series telemetry data identifies respective first values and corresponding respective first timestamps.

13. The method of claim 8, wherein the respective first locations of the tensor indicate respective timestamps of the third timestamps, and wherein the tensor omits storing respective first values of the respective third timestamps.

14. The method of claim 8, wherein populating the tensor with the respective first values comprises:

performing, by the system, a convolution on the respective first values.

15. A non-transitory computer-readable medium comprising instructions that, in response to execution, cause a system comprising a processor to perform operations, comprising:

identifying a first group of time-series telemetry data, wherein the first group of time-series telemetry data identifies respective first values and corresponding respective first timestamps;

creating a tensor that identifies second timestamps;

populating the tensor with the respective first values at respective first locations of the tensor that correspond to the respective first timestamps of the respective first values, wherein populating the tensor comprises combining two values of the respective first values, and wherein a data size of the tensor is less than a data size of the first group of time-series telemetry data; and performing a data science operation on the tensor to produce a first result that indicates a status of a computing device, wherein the first result is within a predetermined threshold value of a second result of performing the data science operation on the first group of time-series telemetry data.

16. The non-transitory computer-readable medium of claim 15, wherein performing the data science operation on the tensor to produce the first result comprises:

expanding the tensor to a second group of time-series telemetry data; and performing the data science operation on the second group of time-series telemetry data.

17. The non-transitory computer-readable medium of claim 16, wherein a first value of the first values of the first group of time-series telemetry data differs from a second value of the second group of time-series telemetry data.

18. The non-transitory computer-readable medium of claim 15, wherein the operations further comprise:
    creating a second group of time-series telemetry data that identifies third timestamps, wherein respective third numerical distances between respective third timestamps of the third timestamps are equidistantly spaced; and
    populating the second group of time-series telemetry data with the respective first values at respective first locations of the second group of time-series telemetry data that correspond to the respective first timestamps of the respective first values, wherein populating the tensor comprises populating the tensor with the respective first values as stored in the second group of time-series telemetry data.

19. The non-transitory computer-readable medium of claim 15, wherein respective first numerical distances between the respective first timestamps are not equidistantly spaced, and wherein respective second numerical distances between respective second timestamps of the second timestamps are equidistantly spaced.

20. The non-transitory computer-readable medium of claim 15, wherein performing the data science operation on the tensor to produce the first result comprises:
    expanding the tensor to a third group of time-series telemetry data; and
    performing the data science operation on the third group of time-series telemetry data.

* * * * *